US006627484B1

(12) United States Patent
Ang

(10) Patent No.: US 6,627,484 B1
(45) Date of Patent: Sep. 30, 2003

(54) METHOD OF FORMING A BURIED INTERCONNECT ON A SEMICONDUCTOR ON INSULATOR WAFER AND A DEVICE INCLUDING A BURIED INTERCONNECT

(75) Inventor: Boon Yong Ang, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/274,241

(22) Filed: Oct. 18, 2002

Related U.S. Application Data

(62) Division of application No. 09/711,629, filed on Nov. 13, 2000, now abandoned.

(51) Int. Cl.[7] .......................... H01L 21/76; H01L 29/786
(52) U.S. Cl. ..................... 438/154; 438/155; 438/221; 438/427
(58) Field of Search ................... 438/218, 219, 438/221, 223, 430, 427, 154, 155

(56) References Cited

U.S. PATENT DOCUMENTS

| 5,023,196 A | * | 6/1991 | Johnsen et al. ............. 438/270 |
| 5,536,675 A | * | 7/1996 | Bohr ......................... 438/427 |
| 5,646,063 A | * | 7/1997 | Mehta et al. ............... 438/424 |
| 5,702,957 A |   | 12/1997 | Padmanabhan ............. 438/262 |
| 5,827,762 A |   | 10/1998 | Bashir et al. ............... 438/202 |
| 5,958,505 A |   | 9/1999 | Mantl ........................ 438/649 |

FOREIGN PATENT DOCUMENTS

| JP | 07-161806 | * | 6/1995 | ............ H01L/21/76 |
| JP | 10-340952 | * | 12/1998 | ......... H01L/21/768 |
| JP | 2002-231951 | * | 8/2002 | ......... H01L/29/786 |

OTHER PUBLICATIONS

S. Wolf, Silicon Processing for the VLSI Era, vol. 2, Lattice Press, 1990, pp. 66–67.*

* cited by examiner

Primary Examiner—Wael Fahmy, Jr.
Assistant Examiner—Anh Duy Mai
(74) Attorney, Agent, or Firm—Renner, Otto, Boisselle & Sklar

(57) ABSTRACT

A buried interconnect can be incorporated into the starting semiconductor on insulator wafer during the early stages of the circuit fabrication process flow for use with semiconductor devices. The buried interconnect provides an additional interconnect layer enabling an overall reduction in the silicon real estate occupied by interconnections. The buried interconnect has low resistance and can prevent the formation of unwanted PN junctions through the use of silicides. The buried interconnect and its fabrication method include an SOI wafer that has an oxidation layer formed on top of a semiconductor layer by oxidation, followed by an nitride layer formed on top of the oxide layer which then is selectively etched to form two trenches with regions of different depths. Some regions of the trenches are etched to remove all of the semiconductor layer in the trench to expose the buried oxide layer. In other regions, a thin layer of semiconductor is left at the bottom of the trenches. Next, all of the exposed surfaces of the trenches are oxidized and the oxide at the trench bottom is removed to expose the underlying semiconductor material. The underlying semiconductor material is then silicided to form a buried interconnect. The wafer, including the trenches, is subsequently covered with oxide and chemical-mechanical polishing is used to remove excess oxide outside the trenches.

8 Claims, 16 Drawing Sheets

METHOD OF FORMING A BURIED INTERCONNECT ON A SEMICONDUCTOR ON INSULATOR WAFER AND A DEVICE INCLUDING A BURIED INTERCONNECT

This application is a division of application Ser. No. 09/711,629 filed Nov. 13, 2000, now abandoned.

TECHNICAL FIELD

The present invention relates generally to semiconductor on insulator processes, and more particularly to a method of forming buried interconnects on wafers and devices including the same.

BACKGROUND OF THE INVENTION

Conventional or bulk semiconductor devices include transistors, and other semiconductor devices, formed in a semiconductor substrate by implanting a well of either P-type or N-type conductivity silicon in a silicon substrate wafer of the opposite conductivity, plus a field oxide to prevent surface inversion. Transistor gates and source/drain diffusions are then manufactured using commonly known processes. These form devices known as metal-oxide-semiconductor (MOS) field effect transistors (FETs). Each of these must be electrically isolated from the others to avoid shorting the circuits.

A relatively large amount of surface area of bulk semiconductor logic circuits is needed for the electrical isolation of the various FETs which is undesirable because it inhibits transistor packing density. Additionally, junction capacitance between the source/drain and the bulk substrate slows the speed at which a device using such transistors operates.

In order to deal with the junction capacitance problem and circuit density, SOI technology has been employed. For example, one method of forming an SOI wafer is using conventional oxygen implantation techniques to create an insulating buried oxide layer at a predetermined depth below the surface of a bulk semiconductor wafer. The implanted oxygen combines with the bulk silicon to form silicon oxide as is well known in the art. A second method of forming an SOI wafer includes depositing an insulating layer of silicon oxide on the surface of a first wafer and then bonding the first wafer to a second wafer using a heat fusion process.

Utilizing SOI technology, an SOI FET includes a source region and a drain region of one semiconductor type on opposite sides of a channel region of the opposite semiconductor type. The SOI FET is isolated by etching a trench around an area, filling the trench with oxide and planarizing this oxide. The area is an island of semiconductor material formed from a semiconductor layer above an insulating buried oxide layer. The appropriate portions of the island are doped to form the source, drain and channel regions. The SOI FET will occupy less surface area on the substrate and will have a lower junction capacitance than an equivalent bulk semiconductor FET because of the insulating trench and the insulated buried oxide layer. This structure improves clock speeds and increases the number of circuit elements that can be placed at a given area.

Unfortunately, die size reduction is also inhibited by the interconnection of the FETS or other devices with each other and other circuit elements. For example, typical interconnections of known complimentary MOS (CMOS) devices are structured to interconnect both P-channel and N-channel FETs and conventionally are metal layers above the bulk substrate. The presence of the metal layers above the bulk substrate inhibits size reduction.

Accordingly, there is a strong need in the art to have an alternative to metal layers above the bulk substrate to reduce the die area occupied by interconnects.

SUMMARY OF THE INVENTION

An object of the present invention is to provide a semiconductor on insulator structure including a plurality of active regions formed on an insulator layer, a plurality of isolation trenches formed between the active regions for substantially isolating adjacent active regions, and at least one interconnection trench that includes an interconnect formed at the bottom of the at least one interconnection trench for electrically connecting a first active region of the active regions to a second active region of the active regions.

Another object of the present invention is to provide a method of forming a semiconductor on insulator structure including forming trenches in a semiconductor material, some of the trenches extending through the semiconductor material to an insulation layer and some of the trenches extending to an intermediate depth; and processing a bottom portion of the trenches extending to the intermediate depth to make the bottom portion electrically conductive.

Another object of the present invention is to provide a method of forming a semiconductor on insulator structure including providing a silicon layer including active regions on an insulation layer, forming a silicon oxide layer on the silicon layer by oxidation, forming a silicon nitride layer on the silicon layer by nitride deposition, forming a trench mask over the silicon nitride layer, etching through the silicon oxide and silicon nitride layers and into the silicon layer with a timed etch, providing an interconnect mask over a portion of the etched semi-conductor layer with the timed etch, etching the etched silicon layer not covered by the interconnect mask with a high silicon to nitride selectivity etch to isolate at least two active regions from each other, stripping the interconnect mask, oxidizing surface silicon exposed by the high silicon to nitride selectivity etch and the timed etch by oxidation, anisotropically etching a portion of the oxidized surface silicon with an anisotropic oxide etch, siliciding the area silicon to form an interconnect, depositing an oxide layer and polishing the oxide layer to the silicon nitride layer, and removing the silicon nitride layer.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 15:
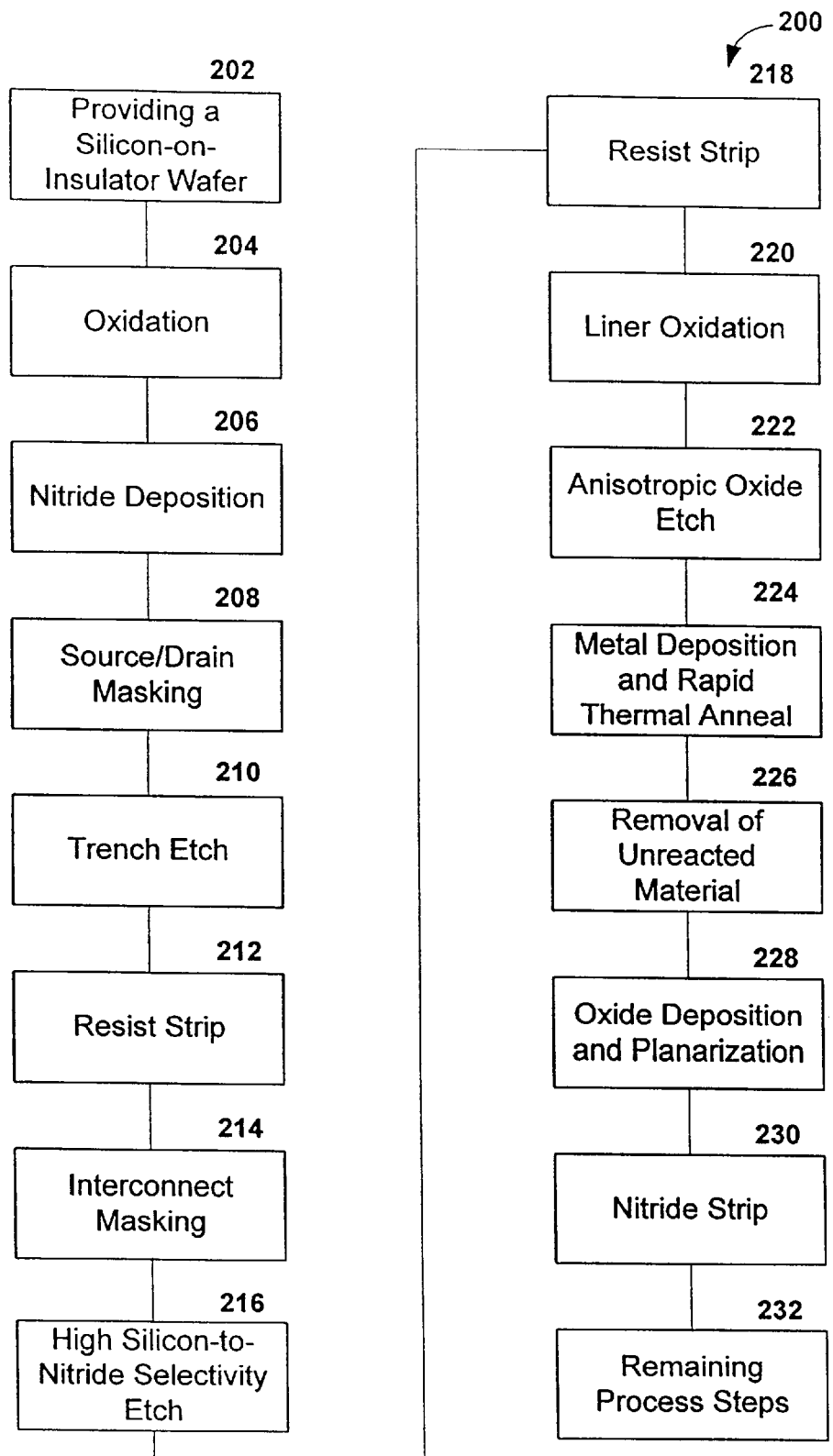
FIG. 15 is a flow chart showing an exemplary process for fabricating an exemplary interconnect according to the present invention.
Figure 16:
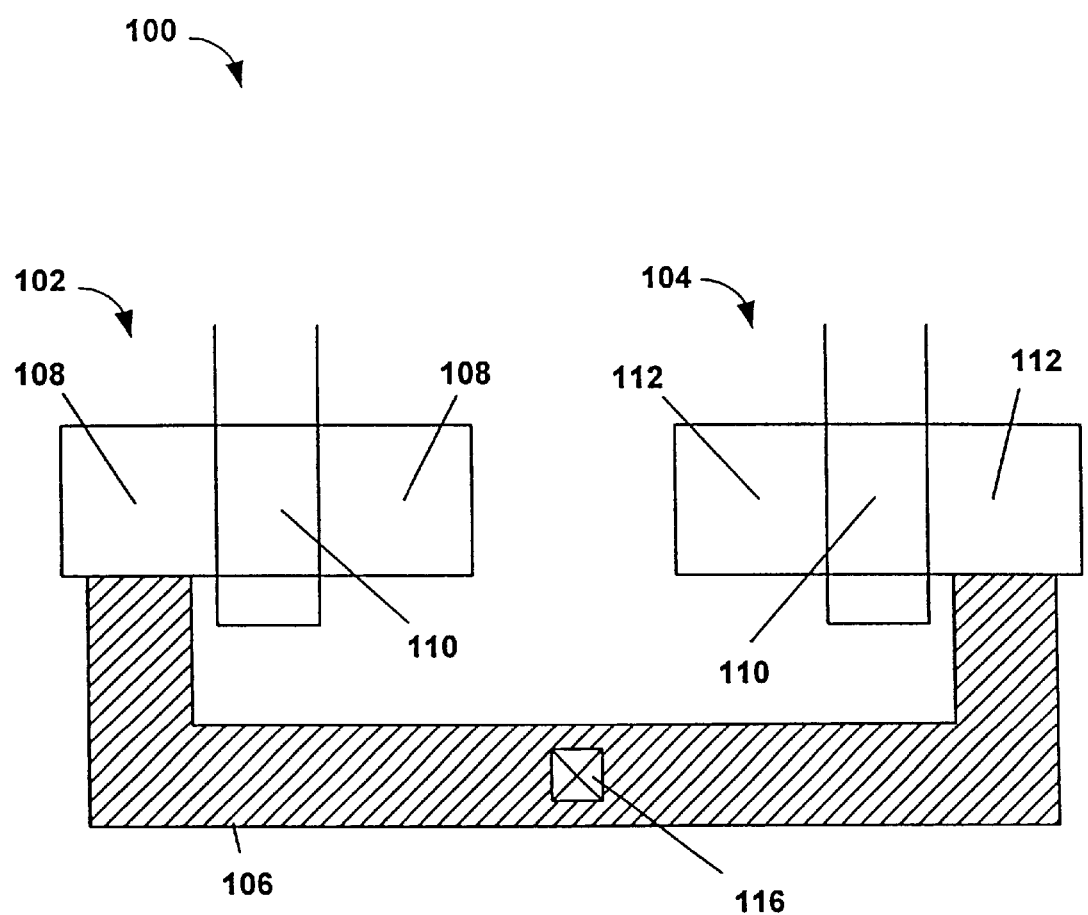
FIG. 16 is a top view of a buried interconnect of the present invention having an alternative geometry.

Referring in detail to FIGS. 1–16 of the drawings, wherein like reference numerals refer to like parts in the several figures, a buried interconnect and a method of forming a buried interconnect in accordance with the present invention are generally indicated. FIGS. 1–14 show a silicon-on-insulator (SOI) wafer that is processed by an exemplary method according to the present invention, such as shown in FIG. 15, to produce a SOI wafer having buried interconnects. FIG. 16 shows a buried interconnect having another possible buried interconnect geometry.

Figure 1:
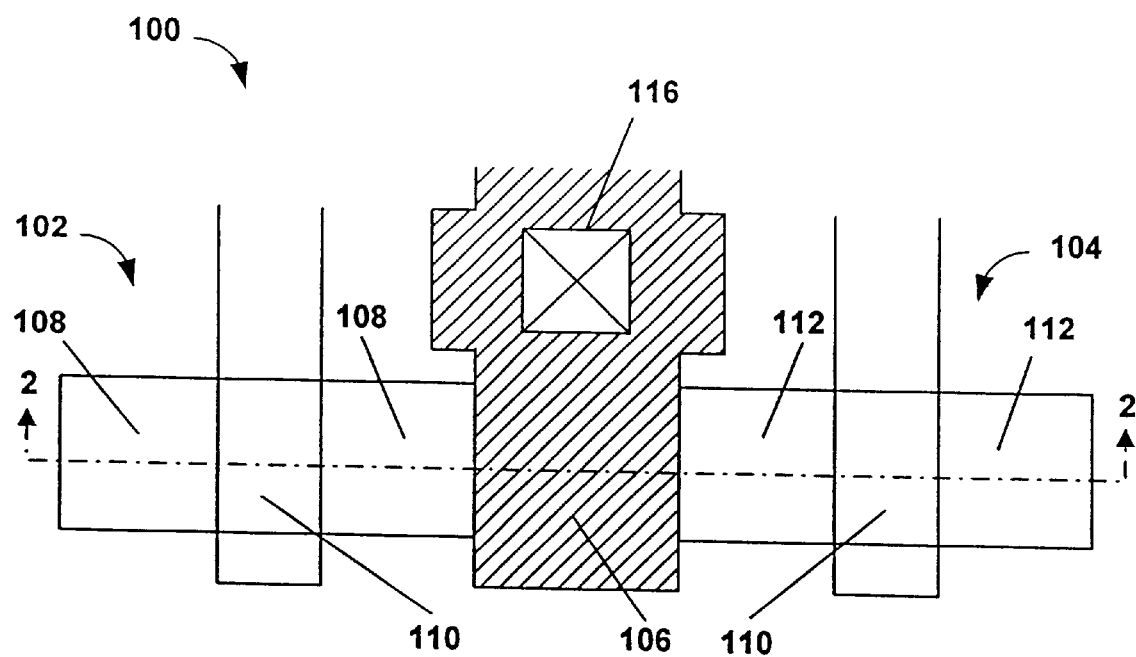
FIG. 1 is a top view of a semiconductor on insulator device having a buried interconnect.

FIG. 1 a top view of an exemplary embodiment of device 100 and shows the interconnection of a first FET 102 with a second FET 104 via the buried interconnect 106. The first FET 102 includes source and drain electrodes 108 and a gate electrode 110. Similarly, the second FET 104 includes source and drain electrodes 112 and a gate electrode 110. One of the source/drain electrodes of 108 of the first FET 102 is connected by the buried interconnect 106 to one of the source/drain electrodes 112 of the second FET 104. The buried interconnect 106 is covered by an oxide material 114 (not shown) and is connected to a contact 116.

Figure 2:
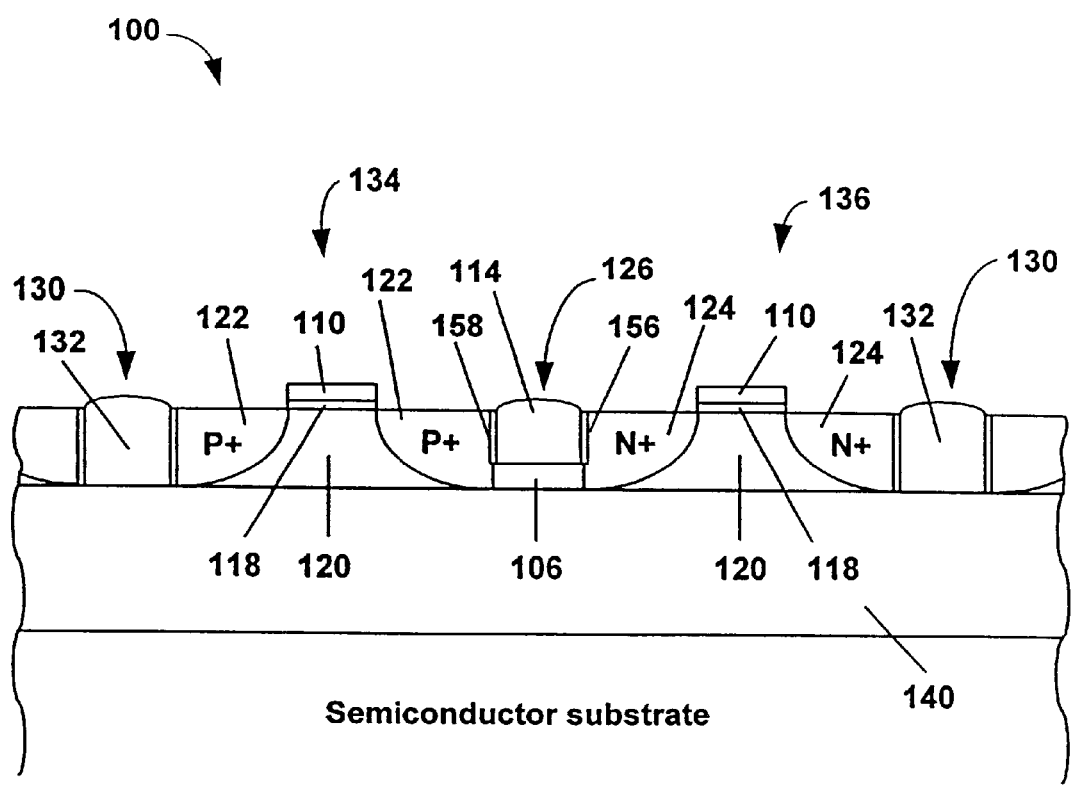
FIG. 2 is a cross-sectional view of FIG. 1.

FIG. 2 shows a cross-sectional view of a device 100 of FIG. 1. The device 100 includes the silicon layer 120 which is doped to form P+ regions 122 and N+ regions 124 that are part of the CMOS FET. The first trench 126 is filled with the oxide material 114 and the second trench 130 is filled with a field oxide material 132. The oxides 114, 132 in the trenches 126, 132 are formed simultaneously by the same oxide deposition step. Gate electrodes 110 and gate oxides 118 are placed on the surface of silicon layer 120 between adjacent P+ regions 122 and between adjacent N+ regions 124. The P+ regions 122 and the gate 110 form the gate, source, and drain of a P type MOS FET 134 and the N+ regions 124 together with the adjacent gate 110 form the gate, source, and drain of an N type MOS FET 136. The P type MOS FET 134 and the N type MOS FET 136 are connected together by the buried interconnect 106 and form the CMOS circuit. As shown in this embodiment, the adjacent drain/source electrodes 122, 124 of the two FETs 134, 136 are connected together by the buried interconnect 106.

Figure 3:
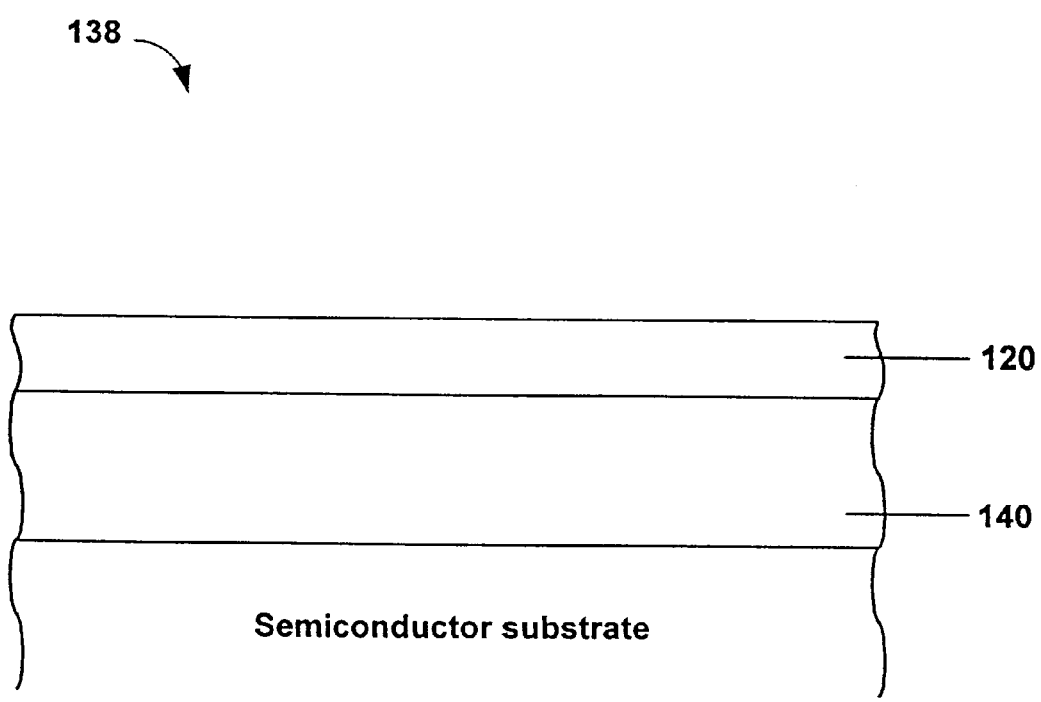
FIG. 3 is a cross-sectional view of an unprocessed SOI wafer.

The device 100 of FIG. 2 is fabricated by processing an unprocessed semiconductor on insulator wafer 138 that includes an insulating layer 140 on a semiconductor substrate and a semiconductor layer 120 such as shown in FIG. 3. Semiconductor on insulator wafers are well known within the art and silicon-on-insulator (SOI) wafers are the most commonly used type of semiconductor on insulator wafer. An SOI wafer has a buried oxide layer 140 as the insulating layer and a silicon layer 120 as the semiconductor layer. For simplicity, the following processing steps are described using a silicon semiconductor although the present invention may be applied to any kind of similar semiconductor on insulator wafer including those made from materials other than silicon. Additionally, the term layers is used to describe area of similar or common composition or properties and is not intended to be limited to discreet sheets of material. For example, a sheet of material which has another material implanted therein such that there are multiple compositions in the sheet may be described as having multiple layers. A layer may also have a varying composition and still be described as a layer.

Initially, the unprocessed wafer 138 of FIG. 3 is oxidized to form a wafer having a silicon oxide layer 142. This results in the wafer of FIG. 4. The silicon oxide layer 142 is preferably silicon dioxide but may also be non-stoichiometric silicon oxide.

Figure 4:
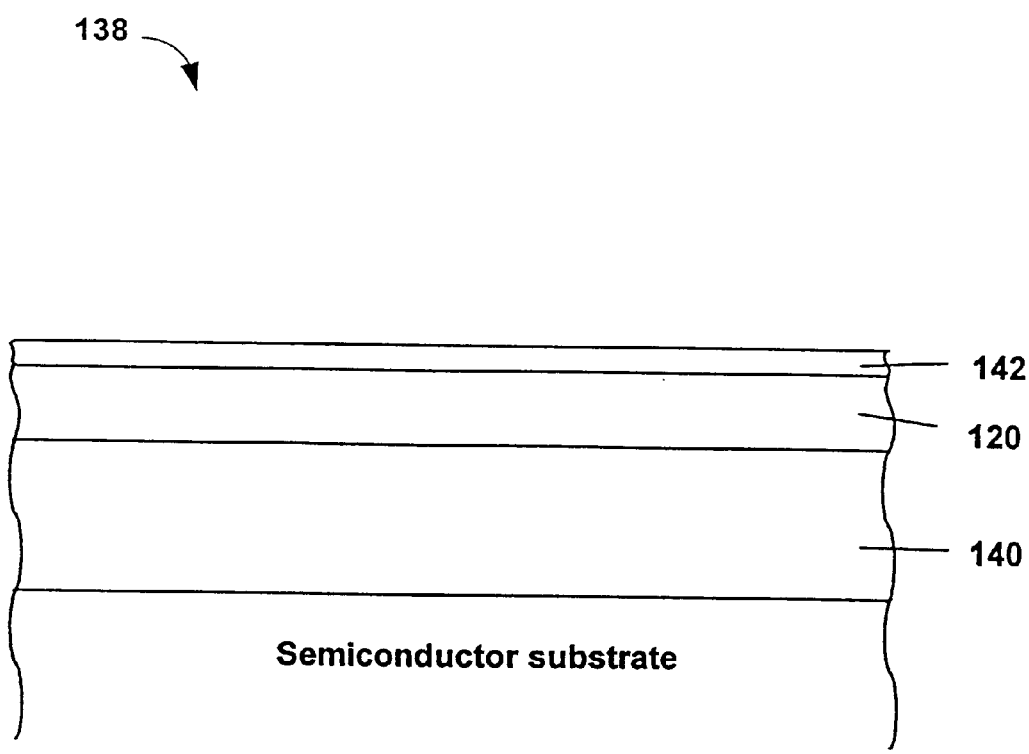
FIG. 4 is a cross-sectional view of FIG. 3 after completing a first processing step of an exemplary embodiment of the present invention.

Next, the wafer of FIG. 4 undergoes nitride deposition to form a silicon nitride layer 144 on the silicon oxide layer 142. This results in the wafer of FIG. 5. The silicon nitride layer 144 may be composed of any type of silicon nitride and may include other elements such as oxygen. The silicon nitride layer 144 alternatively can be formed by any process capable of forming the silicon nitride layer 144.

Figure 5:
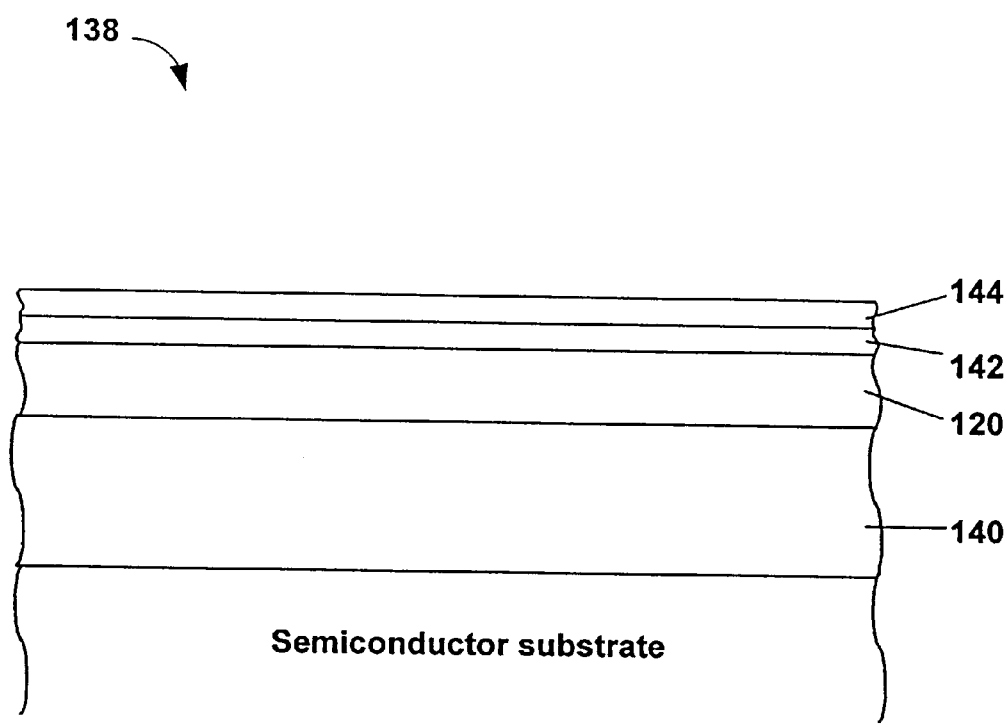
FIG. 5 is a cross-sectional view of FIG. 4 after completing a second processing step of an exemplary embodiment of the present invention.

Next, a source/drain mask 146 is applied to the wafer of FIG. 5 to selectively cover portions of the silicon nitride layer 144 thereby forming active regions and field regions. This results in the wafer of FIG. 6. The source/drain mask 146 includes openings 148 that correspond to the field regions and masked portions the correspond to the active regions. Those regions which are covered by the mask 146 will become the active regions of the resultant device while those regions not covered by the mask 146 will become the field regions. The active regions define the silicon islands whereas the field regions define regions which either insulate the active regions or include the buried interconnect of the present invention to interconnect elements of the active regions as will be appreciated. The source/drain mask 146 may be formed by any known masking technique. For example, a layer of positive or negative photoresist is formed and patterned using conventional lithographic techniques.

Figure 6:
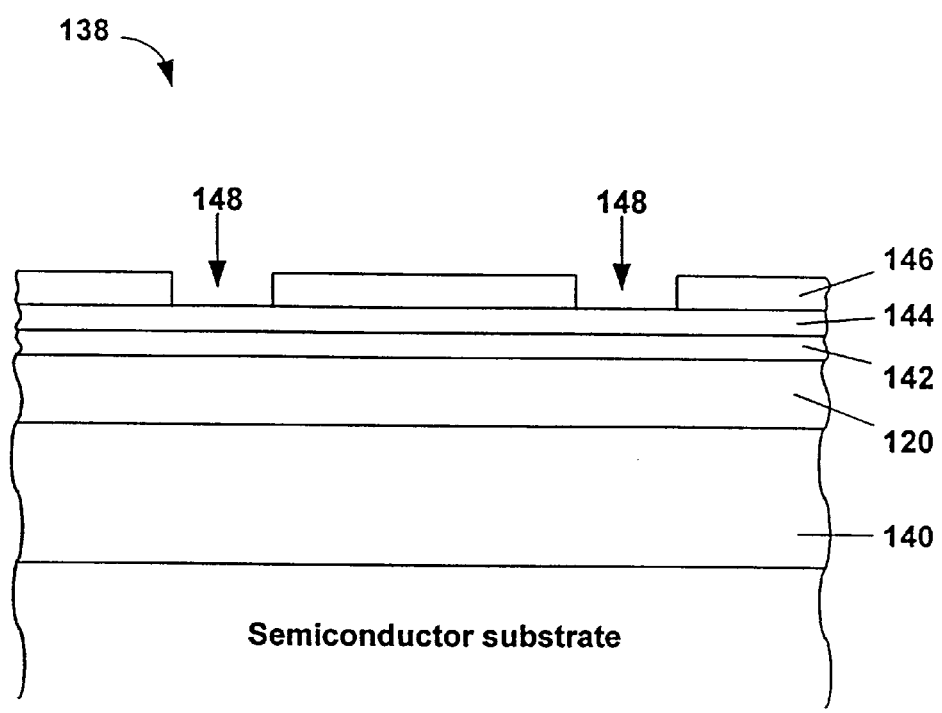
FIG. 6 is a cross-sectional view of FIG. 5 after completing a third processing step of an exemplary embodiment of the present invention.

Next, trench etching is performed on the wafer of FIG. 6 at the openings 148 of the source/drain mask 146 to etched through the silicon nitride layer 144, the silicon oxide layer 142 and into the silicon layer 120. The trench etching forms the first and second trenches 126, 130 and results in the wafer of FIG. 7. The trench etch is controlled so as to remove all but a portion of the silicon underneath the mask openings 148 from the silicon layer 120. The trench etch may be, for example, a timed etch.

Figure 7:
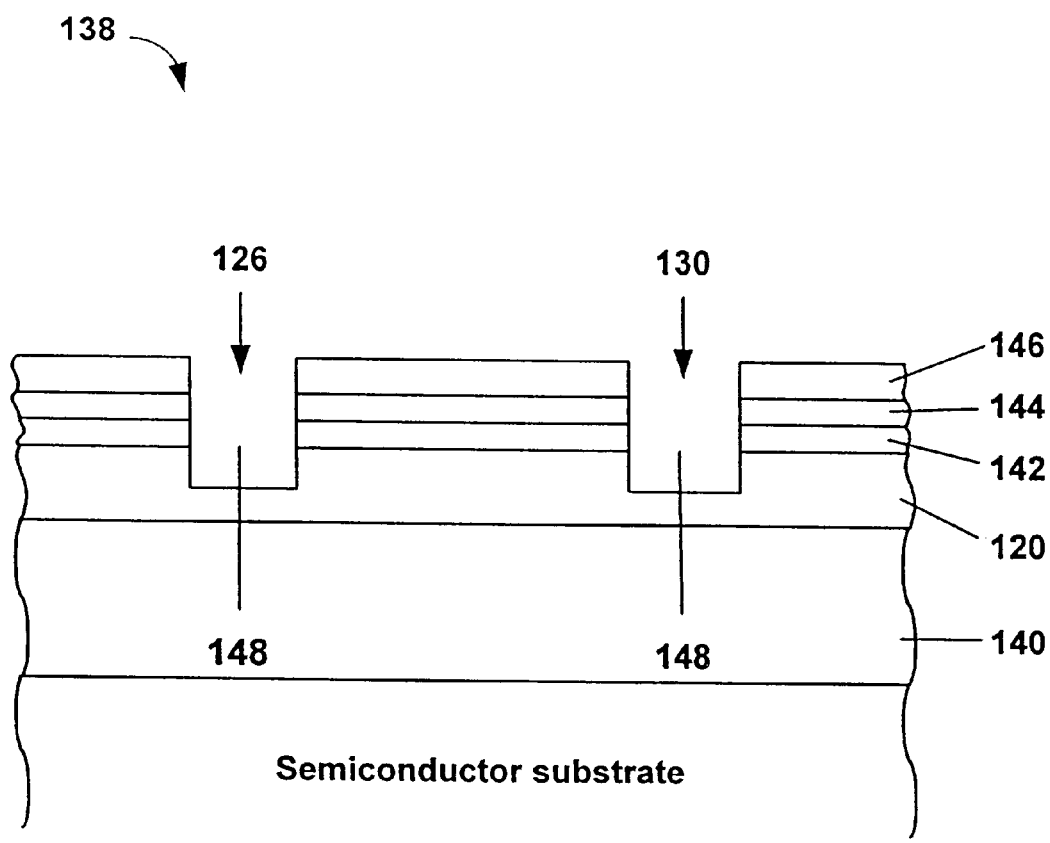
FIG. 7 is a cross-sectional view of FIG. 6 after completing a fourth processing step of an exemplary embodiment of the present invention.

Next, an interconnect mask 150 is applied to the wafer of FIG. 7 to cover the first trench 126 to prevent removal of the silicon which will eventually be processed into the buried interconnect 106. The source/drain mask 146 is stripped off of the silicon nitride layer 144 prior to formation of the interconnect mask 150. This results in the wafer of FIG. 8. The interconnect mask 150 protectively covers at least those exposed portions of silicon layer 120 in which etching is not desired and may also protectively cover any other layer except where etching is to be performed. However, it is unnecessary to place the interconnect mask 150 anywhere other than over the first trench 126 since the silicon nitride layer 144 will also protect against etching in the next step.

Figure 8:
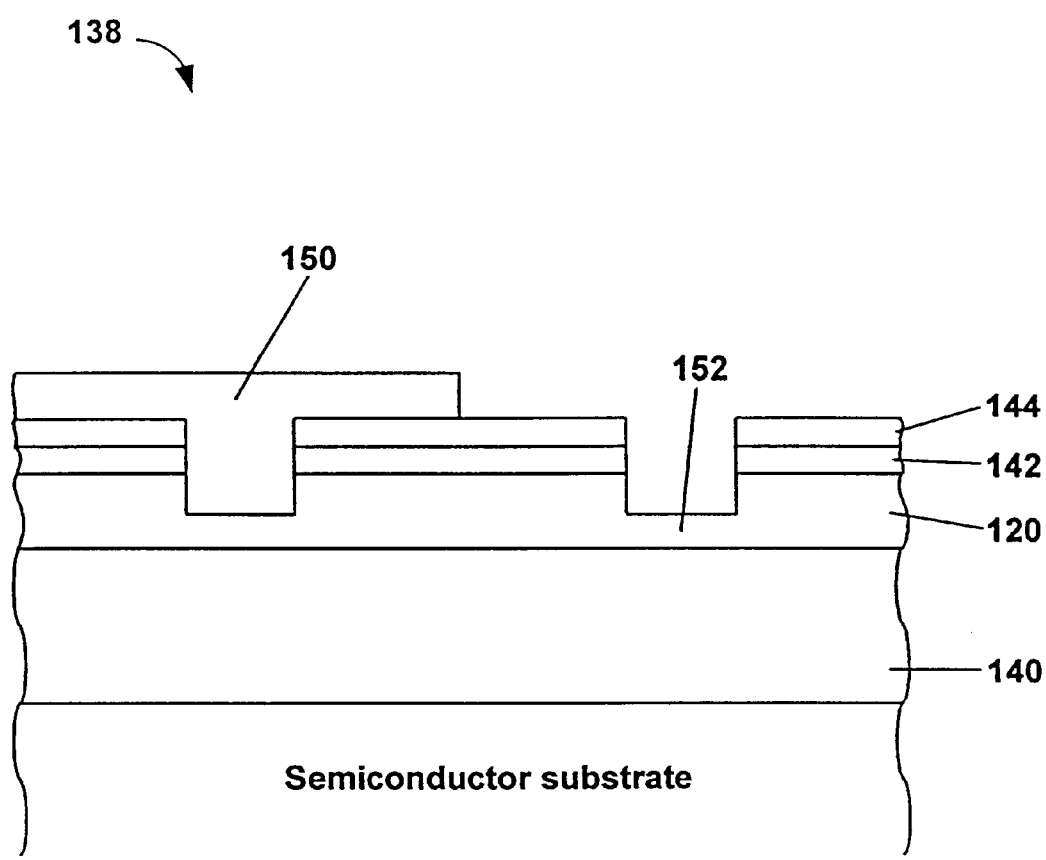
FIG. 8 is a cross-sectional view of FIG. 7 after completing a fifth processing step of an exemplary embodiment of the present invention.

Next, high silicon-to-nitride selectivity etching of the wafer of FIG. 8 is performed to remove a remaining portion 152 of the silicon layer 120 in the second trench 130 to expose the buried oxide 140. The interconnect mask 150 is removed after completion of the etch. This results in the wafer of FIG. 9. Exposed silicon portions 154 of the silicon layer 120 are located along the sides and bottom of the first trench 126 and along the sides of the second trench 130. There is no exposed silicon portion 154 along the bottom of the second trench 130. Alternatively, any kind of etch which removes the remaining portion 152 from the bottom of the second trench 130 without etching other areas may be used.

Figure 9:
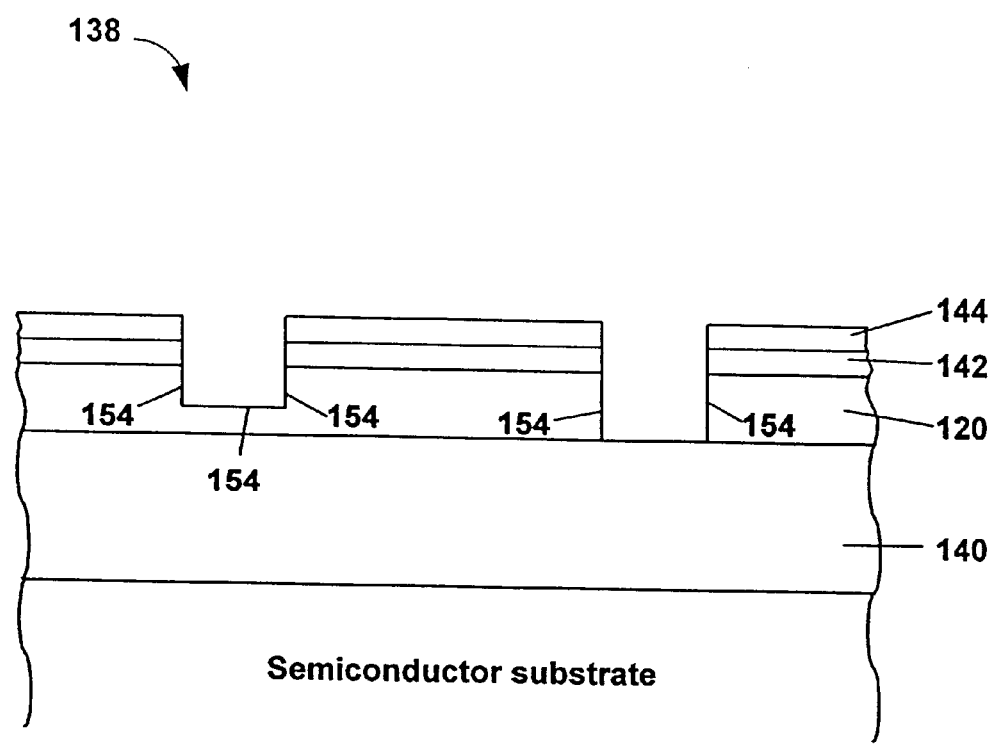
FIG. 9 is a cross-sectional view of FIG. 8 after completing a sixth processing step of an exemplary embodiment of the present invention.

Next, oxidation of the exposed silicon portions 154 of the silicon layer 120 of the wafer of FIG. 9 is performed to form silicon oxide sides 156 in the second trench 130, and silicon oxide sides 158 and a silicon oxide bottom 160 in the first trench 126. This results in the wafer of FIG. 10. The oxidation may be a thermal oxidation or any other kind of oxidation which will oxidize the exposed silicon portions 154. The silicon oxide sides 156, 158 are used to prevent silicidation later in the fabrication process.

Figure 10:
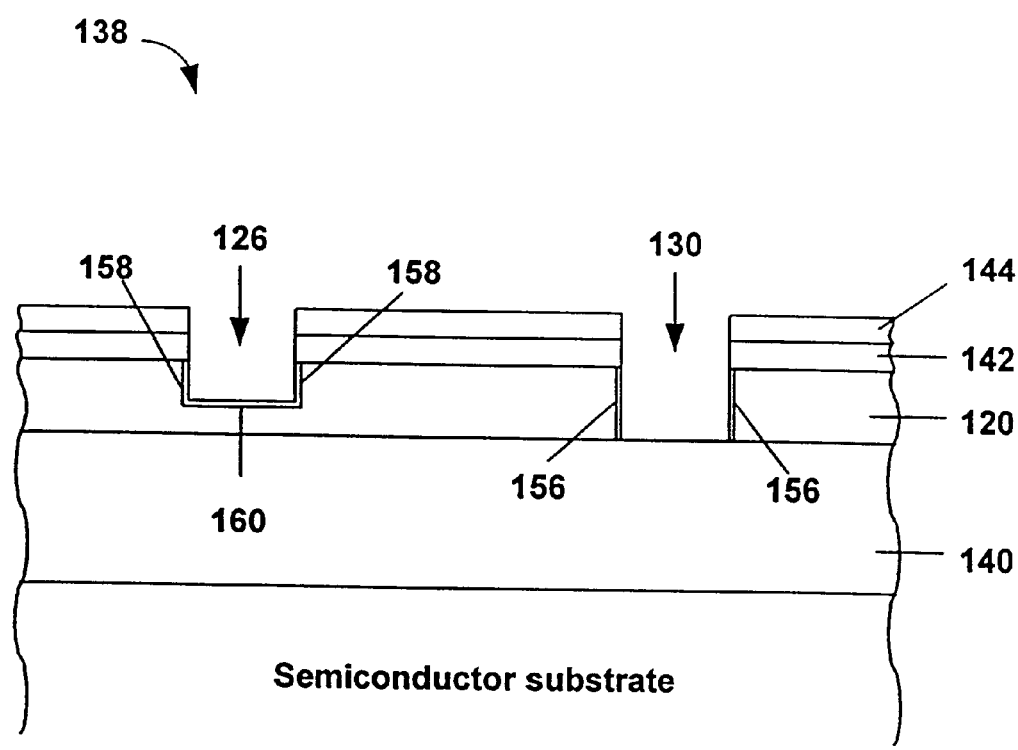
FIG. 10 is a cross-sectional view of FIG. 9 after completing a seventh processing step of an exemplary embodiment of the present invention.
Figure 11:
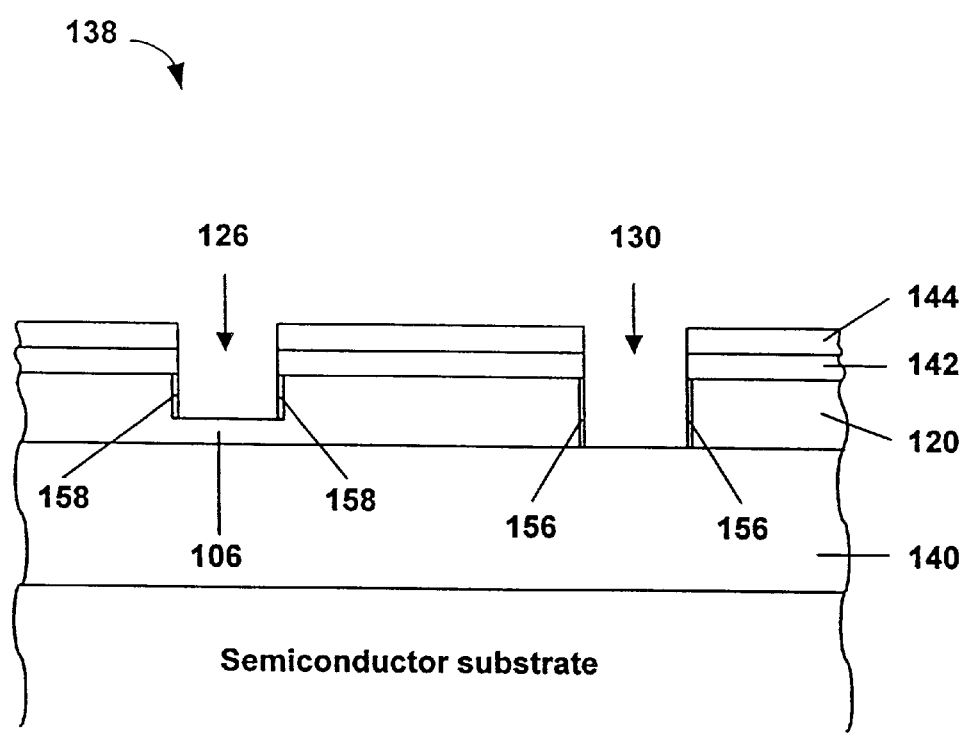
FIG. 11 is a cross-sectional view of FIG. 10 after completing an eighth processing step of an exemplary embodiment of the present invention.

Next, an anisotropic oxide etch is performed on the wafer of FIG. 10 to remove the silicon oxide bottom 160. However, the silicon oxide 156, 158 along the walls of the trenches 126, 130 is not removed by the anisotropic oxide etch because of the directionality of the etch. This results in the wafer of FIG. 11. The selective removal of the silicon oxide bottom 160 exposes the silicon underneath the silicon oxide bottom 160 and allows silicidation of the exposed silicon portions 154 by depositing a metal, e.g., Ti, Co or W followed by a rapid thermal anneal. The silicidation increases the conductivity of the exposed silicon thereby forming a buried interconnect 106 as shown in the cross-sectional view of FIG. 12. The silicidation is performed until the exposed silicon becomes a good conductor. However, any method by which the conductivity of the buried interconnect 106 is greatly increased so as to provide a conductive path may be used instead of the silicidation. For example, the buried interconnects 106 could be made of three different elements instead of being a binary compound which normally results from silicidation.

Next, any unreacted material is removed. This results in the buried interconnect containing SOI wafer 138 of FIG. 12 which offers an additional method of electrically connecting circuit elements besides the traditional backend of line interconnects. As a result, the overall area occupied by interconnects may be reduced.

Figure 12:
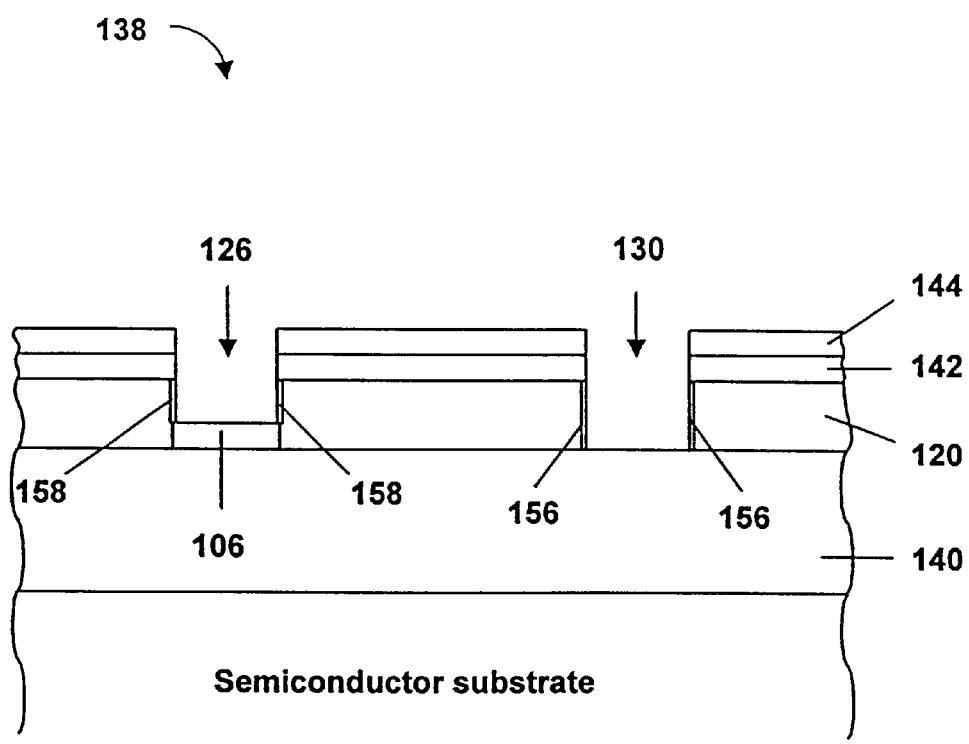
FIG. 12 is a cross-sectional view of FIG. 11 after completing a ninth processing step of an exemplary embodiment of the present invention.
Figure 13:
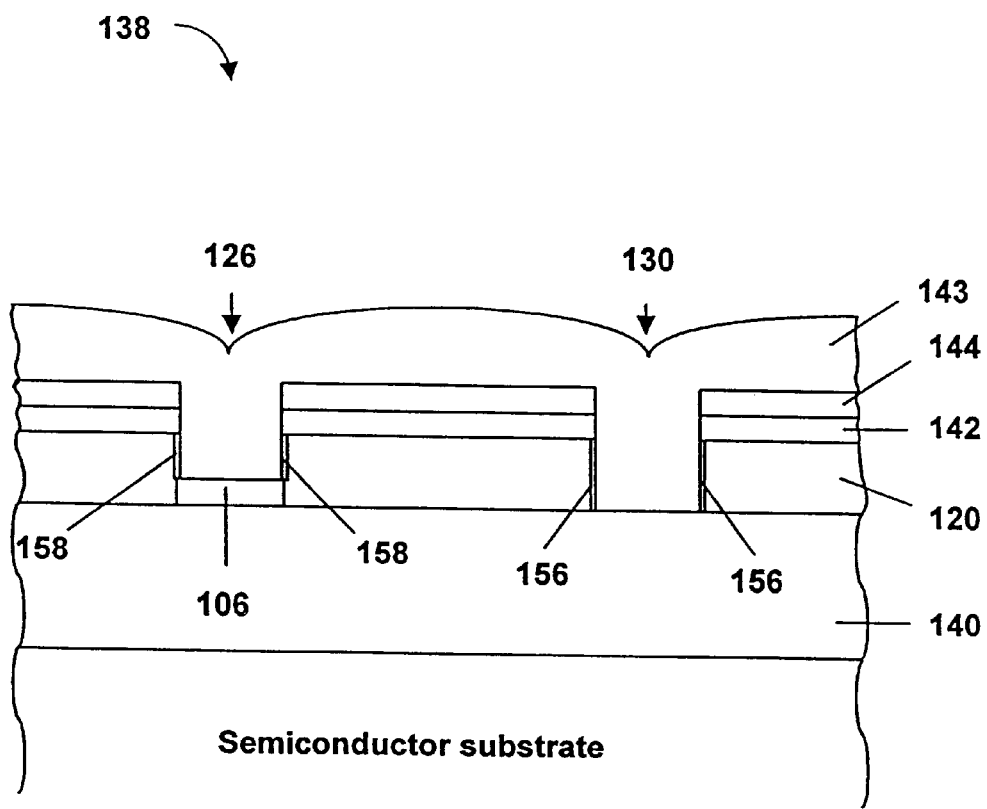
FIG. 13 is a cross-sectional view of FIG. 12 after completing a tenth processing step of an exemplary embodiment of the present invention.
Figure 14:
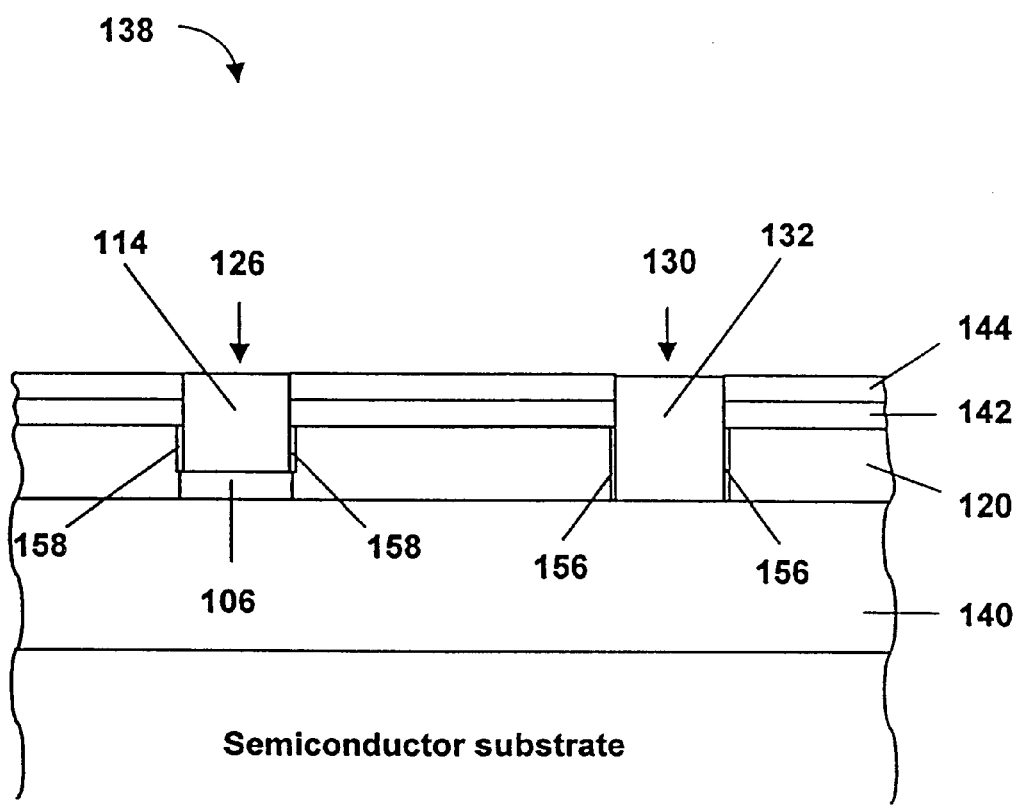
FIG. 14 is a cross-sectional view of FIG. 13 after completing an eleventh processing step of an exemplary embodiment of the present invention.

Next, oxide 143 is deposited over the wafer of FIG. 12 to fill the trenches and form the wafer of FIG. 13. The wafer of FIG. 13 is then polished down to the silicon nitride layer 144 by chemical mechanical polishing or any other polishing method to remove excess oxide 143. This results in all of the oxide outside the trenches 126, 130 being polished away leaving oxides 114, 132 and forms the wafer of FIG. 14. The polishing does not remove any of the others layers because the silicon nitride layer 144 acts as a polishing stop layer. The silicon nitride layer 144 is then stripped from the wafer of FIG. 14. The wafer of FIG. 14 then undergoes further fabrication, such as the formation of transistors, to complete the circuit.

FIG. 15 is a flow chart 200 showing an exemplary method of fabricating a buried interconnect 106 according to the present invention. The flow chart 200 begins with the step of providing a silicon-on-insulator wafer 202. Alternatively, the wafer may be a semiconductor on insulator wafer composed of a material other than silicon (e.g., germanium). However, solely for brevity, a silicon-on-insulator wafer will be described with regard to the flow chart 200.

Next the wafer undergoes oxidation 204 to form the silicon oxide layer 142 which is then followed by a nitride deposition step 206 to form the silicon nitride layer 144. Next, the step of forming a source/drain masking 208 is performed. Next, the trenches 126, 130 are formed by a trench etch 210. The trenches 126, 130 will eventually be processed into two different types of structures. The first type of trench 126 will include the buried interconnects 106 while the second type of trench 130 will only contain the field oxide 132.

After completion of the trench etch 210, the source/drain mask 146 is stripped by a resist strip step 212 and the interconnect mask 150 is provided by an interconnect masking step 214. The interconnect mask 150 covers those trenches which will eventually include the buried interconnects 106.

A high silicon-to-nitride selectivity etch 216 results in differentiation of trenches into two kinds of trenches. The first trench 126 includes a silicon portion at the trench bottom while the second trench 130 is stripped clear of silicon to expose the buried oxide 140 at the trench bottom.

Next the interconnect mask 150 is removed in a resist strip step 218 to expose part of the silicon layer. The exposed parts 154 of the silicon layer 120 are oxidized in a liner oxidation step 220 so as to transformed the exposed parts 154 into silicon oxide. The buried interconnect 106 is formed at the bottom of the trench 126 by an anisotropic oxide etch 222 followed by silicidation performed by a metal deposition and rapid thermal anneal step 224. The metal deposition and rapid thermal anneal step 224 deposits a thin metal film of Ti, Co, W or any other material useful for silicidation of the buried interconnect 106 and then performs a rapid thermal anneal to achieve silicidation of the buried interconnect 106. The unreacted metal or other material is then removed in the removal of unreacted material step 226.

Next, the trench oxides 114, 132 are formed in an oxide deposition and planarization step 228. This step 228 coats the wafer of FIG. 12 with an oxide 143 that fills the trenches 126, 130. Chemical mechanical polishing is then performed until the silicon nitride layer 144 is reached. The properties of the silicon nitride 144 enable it to act as a stop layer for the chemical mechanical polishing leaving the surface planarized with the silicon nitride layer 144. The silicon nitride 144 is then removed in a nitride strip step 230. At this point, a buried interconnect containing wafer 138 has been completely formed. Now a desire device incorporating a buried interconnect 106 can be fabricated by performing the remaining processing steps 232 necessary to complete the fabrication of the desired device.

Certain modifications to the steps of flow chart 200 shown in FIG. 15 can be made. For example, those of ordinary skill in the art will understand that other additional steps may be incorporated into the present invention.

FIG. 16 a top view of another exemplary embodiment of a device 100 having a buried interconnect 106 with another possible buried interconnect geometry. The buried interconnect 106 of FIG. 16 is substantially the same as that shown in FIG. 1 except that instead of the exterior and not the adjacent source/drain electrodes 110, 112 are connected by the buried interconnect 106. The buried interconnects 106 also can be used to connect three or more circuit elements, if needed. The geometries of the buried interconnect 106 show in FIGS. 1 and 16 are exemplary geometries and numerous other geometries are possible. All such geometries are intended to be within the scope of the invention.

The foregoing device has certain advantages. For example, the additional interconnect layer may be incorporated into devices without greatly increasing their complexity or production cost and is compatible with conventional CMOS fabrication technologies that use shallow-trench isolation. This interconnect layer of the present invention has the further advantage of having high conductivity. Furthermore, the presence of the silicide prevents the formation of unintentional PN junctions. The additional interconnect layer provided by the buried interconnect also enables the reduction of the silicon real estate occupied by the interconnects, thus allowing the overall reduction in the die size, especially in a circuit where the die size is determined by the interconnects. The use of the high nitride-to-silicon selectivity etch and the use of the nitride layer 144 as a mask removes the need to have extremely good overlay during interconnect masking.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit of the scope of the appended claims.

What is claimed is:

1. A method of forming a semiconductor on insulator structure, the method comprising the steps of:

providing a semiconductor on insulator (SOI) substrate including a bulk semiconductor substrate, an insulation layer formed on the bulk semiconductor substrate, and an active layer of semiconductor material formed on the insulation layer;

performing a first trench etch by etching a plurality of trenches from a top surface of the active layer only partially through the active layer;

performing a second trench etch following the first trench etch by further etching only a subset of the plurality of trenches completely through the active layer to the insulation layer;

performing an oxidation step to form oxide on the exposed surfaces of the active layer in the plurality of trenches, including the sides of the trenches etched completely through the active layer and the sides and bottom of the trenches etched only partially through the active layer;

performing an anisotropic oxide etch to remove oxide formed at the bottom of trenches etched only partially through the active layer while retaining oxide formed on the sides of the plurality of trenches; and siliciding the bottom of the trenches etched only partially through the active layer to render at least a portion of the active layer conductive to electrically connect regions of the active layer on opposite sides of the trenches etched only partially through the active layer, wherein the oxide formed on the sides of the plurality of trenches prevents silicidation along the sides of the plurality of trenches.

2. The method of claim 1, further comprising filling the plurality of trenches with an insulator material.

3. The method of claim 1, wherein the first trench etch and the second trench etch each includes performing a timed etch.

4. The method of claim 1, further comprising deposition of a nitride on the top surface of the active layer of semiconductor material.

5. The method of claim 1, further comprising:

filling the plurality of trenches with oxide; and chemical mechanical polishing away excess oxide.

6. The method according to claim 1, further comprising forming at least one semiconductor device.

7. A method of forming a semiconductor on insulator structure comprising:

providing a silicon layer including active regions on an insulation layer formed on a bulk semiconductor substrate:

forming a silicon oxide layer on the silicon layer by oxidation;

forming a silicon nitride layer on the silicon layer by nitride deposition;

forming a trench mask over the silicon nitride layer;

etching through the silicon oxide and silicon nitride layers and into the silicon layer with a timed etch;

providing an interconnect mask over a portion of the etched semi-conductor layer with the timed etch;

etching the etched silicon layer not covered by the interconnect mask with a high silicon to nitride selectivity etch to isolate at least two active regions from each other;

stripping the interconnect mask;

oxidizing surface silicon exposed by the high silicon to nitride selectivity etch and the timed etch by oxidation;

anisotropically etching a portion of the oxidized surface silicon with an anisotropic oxide etch;

siliciding the area silicon to form an interconnect;

depositing an oxide layer and polishing the oxide layer to the silicon nitride layer; and removing the silicon nitride layer.

8. The method of claim 7, wherein the silicon nitride layer acts as a stop layer for the polishing.

* * * * *

UNITED STATES PATENT AND TRADEMARK OFFICE
CERTIFICATE OF CORRECTION

PATENT NO.   : 6,627,484 B1
DATED        : September 30, 2003
INVENTOR(S)  : Ang It is certified that error appears in the above-identified patent and that said Letters Patent is hereby corrected as shown below:

<u>Column 8,</u>
Line 36, replace "strate:" with -- strate; --.

Signed and Sealed this

Second Day of December, 2003

JAMES E. ROGAN
*Director of the United States Patent and Trademark Office*